(12) United States Patent
Nakao et al.

(10) Patent No.: US 8,102,661 B2
(45) Date of Patent: Jan. 24, 2012

(54) PORTABLE TERMINAL

(75) Inventors: Junichi Nakao, Tokyo (JP); Hiroyasu Yamada, Shizuoka (JP)

(73) Assignee: NEC Corporation, Tokyo (JP)

( * ) Notice: Subject to any disclaimer, the term of this patent is extended or adjusted under 35 U.S.C. 154(b) by 361 days.

(21) Appl. No.: 12/524,339

(22) PCT Filed: Jan. 25, 2008

(86) PCT No.: PCT/JP2008/051041
§ 371 (c)(1),
(2), (4) Date: Jul. 23, 2009

(87) PCT Pub. No.: WO2008/090972
PCT Pub. Date: Jul. 31, 2008

(65) Prior Publication Data
US 2009/0323298 A1 Dec. 31, 2009

(30) Foreign Application Priority Data

Jan. 25, 2007 (JP) ................................ 2007-014550

(51) Int. Cl.
*H05K 7/02* (2006.01)

(52) U.S. Cl. ..................... 361/752; 361/730; 455/575.3; 455/575.4

(58) Field of Classification Search .................. 361/730, 361/752, 749; 455/575.1, 575.3, 575.4
See application file for complete search history.

(56) References Cited

U.S. PATENT DOCUMENTS

| | | | | |
|---|---|---|---|---|
| 6,914,982 B2 * | 7/2005 | Toyoda et al. | ........... | 379/433.13 |
| 7,177,161 B2 * | 2/2007 | Shima | ........... | 361/816 |
| 7,414,855 B1 * | 8/2008 | Arnold | ........... | 361/752 |
| 7,826,806 B2 * | 11/2010 | Choi | ........... | 455/90.3 |
| 7,885,653 B2 * | 2/2011 | Yamamoto et al. | ........ | 455/432.3 |
| 7,952,889 B2 * | 5/2011 | Chao | ........... | 361/816 |
| 2010/0048249 A1 * | 2/2010 | Furuta et al. | ........... | 455/566 |

FOREIGN PATENT DOCUMENTS

| | | |
|---|---|---|
| JP | 1993333362 A | 12/1993 |
| JP | 1998145476 A | 5/1998 |
| JP | 2000078253 A | 3/2000 |
| JP | 2006352618 A | 12/2006 |

OTHER PUBLICATIONS

International Search Report for PCT/JP2008/051041 mailed Apr. 15, 2008.

* cited by examiner

*Primary Examiner* — Dameon Levi

(57) ABSTRACT

A portable terminal characterized by comprises: a first substrate; a double-sided tape adhered to a prescribed portion of said first substrate; a second substrate adhered to said double-sided tape on a side thereof that is opposite the side on which said first substrate is located and having an electronic part mounted on a side thereof that is opposite the side affixed to said double-sided tape; an upper case disposed on a side of said first substrate, opposite the side where said doubled-sided tape is located; a lower case disposed on a side of the electronic part, opposite the side where said second substrate is located, and combined with said upper case; and a frame placed between said second substrate and said lower case and having an opening at a position corresponding to said electronic part.

14 Claims, 4 Drawing Sheets

(FIRST EXEMPLARY EMBODIMENT)

FIG. 1 (FIRST EXEMPLARY EMBODIMENT)

(FIRST EXEMPLARY EMBODIMENT)

PORTABLE TERMINAL

This application is the National Phase of PCT/JP2008/051041, filed Jan. 25, 2008, which is based upon and claims priority from Japanese Patent Application No. 2007-014550 (filed on Jan. 25, 2007), which is incorporated hereby reference thereto.

TECHNICAL FIELD

This invention relates to a portable terminal in which a plurality of substrates are superimposed and housed in a case.

BACKGROUND ART

Conventionally, in some portable terminals in which a plurality of substrates (two, for example) are superimposed and housed in a case, the first and second substrates are fixed by a frame formed of plastic or metal. For example, with reference to FIG. 4, a portable terminal 101 comprises an upper case 103a and a lower case 103b that form a hollow case; a substrate 110 (which includes mounted electronic parts 111, 113 and shielding parts 112, 114) placed inside the case on the side of upper case 103a; a substrate 120 (which includes a mounted electronic part 121) placed inside the case on the side of lower case 103b; and a frame 130 placed inside the case between the substrates 110 and 120 and having a claw portion 130a for securing the substrate 110 and a claw portion 130b for securing the substrate 120; wherein an assembly comprising the substrates 110, the substrate 120 and the frame 130 is embraced by the upper case 103a and the lower case 103b. The claw portions 130a, 130b of the frame 130 secure the substrates 110, 120 in such a manner that they will not be dislodged in the stacking direction. As a result, the assembly comprising the substrates 110, 120 and frame 130 is secured to the case.

[Patent Document 1] Japanese Patent Kokai Publication No. JP-P2000-78253A

SUMMARY

The content disclosed in Patent Document 1 cited above is hereby incorporated by reference herein. The present invention offers an analysis of the related art, as set forth below.

With the arrangement shown in FIG. 4, since it is desired that the substrates 110, 120 be resistant to flexing so as not become disengaged from the claw portions 130a, 103b, a problem which arises is an increase in the thickness of the portable terminal. Further, in a case where one of the substrates 110, 120 is a thin, flexible substrate that readily disengages from the claw portions 130a, 130b, it is necessary to raise rigidity as by affixing a rigid plate to the substrate, as in Patent Document 1. Thus the problem of increased thickness of the portable terminal cannot be avoided.

It is an object of the present invention to reduce thickness while securing a plurality of substrates inside a case.

In one aspect of the present invention, a portable terminal comprises: a first substrate; a double-sided tape adhered to a prescribed portion of the first substrate; a second substrate adhered to the double-sided tape on a side thereof that is opposite the side on which the first substrate is located and having an electronic part mounted on a side thereof that is opposite the side affixed to the double-sided tape; an upper case disposed on a side of the first substrate that is opposite the side where the doubled-sided tape is located; a lower case disposed on a side of the electronic part, opposite the side where the second substrate is located, and combined with the upper case; and a frame placed between the second substrate and the lower case and having an opening at a position corresponding to the electronic part.

In the portable terminal of the present invention, preferably an assembly comprising the first substrate, the double-sided tape and the second substrate is embraced by the upper case and the lower case.

In the portable terminal of the present invention, preferably the second substrate is urged toward the side of the first substrate by the frame.

In the portable terminal of the present invention, preferably the second substrate is a flexible wiring board.

In the portable terminal of the present invention, preferably the first substrate has an electronic part mounted on a side thereof on which the second substrate is located, and has a shielding part, which comprises a metal plate for blocking noise of the electronic part of the first substrate, mounted so as to cover the electronic part; wherein the double-sided tape is adhered to the shielding part of the first substrate.

In the portable terminal of the present invention, preferably the shielding part is mounted on the first substrate so as to encompass at least an area where the frame abuts against the second substrate.

In accordance with the present invention, the first substrate and the second substrate are secured by the double-sided tape and are embraced by the upper case and the lower case, and the second substrate is urged toward the side of the first substrate by the frame. It is therefore possible for the first and second substrates to be strongly secured. Further, even in a case where a thin, flexible wiring board is used, as with the second substrate, it is possible for the first and second substrates to be strongly secured in similar fashion. Furthermore, since the frame is so adapted that the frame urges the region of the second substrate in the area of the substrate other than that of the electronic part toward the side of the upper case, it is possible to strongly secure the assembly, which comprises the first and second substrates and the double-sided tape, without influencing the thickness of the assembly. As a result, thinning of the portable terminal is achieved.

Figure 1:
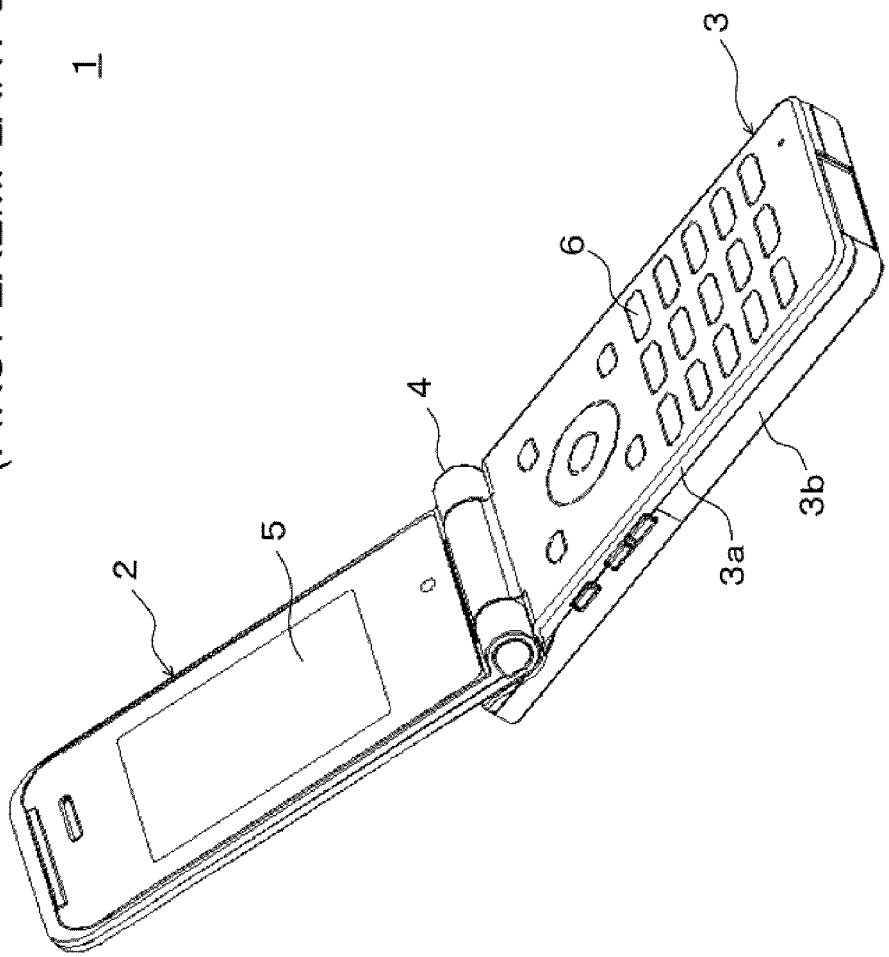
FIG. 1 is a perspective view schematically illustrating the configuration of a portable terminal according to a first exemplary embodiment of the present invention, the terminal being shown in the opened state.

DESCRIPTION OF REFERENCE SYMBOLS 1, 101 portable terminal
2 first case
3 second case
3a, 103a upper case
3b, 103b lower case
4 hinge portion
5 display portion 6 button portion
10, 110 substrate (first substrate)
11, 13, 111, 113 electronic part
12, 14, 112, 114 shielding part
20, 120 substrate (second substrate)
21, 121 electronic part
30 frame
30a opening
30b projection
40 double-sided tape
50 screw
130 frame
130a, 130b claw portion

PREFERRED MODES FOR CARRYING OUT
THE INVENTION

First Exemplary Embodiment

Figure 2:
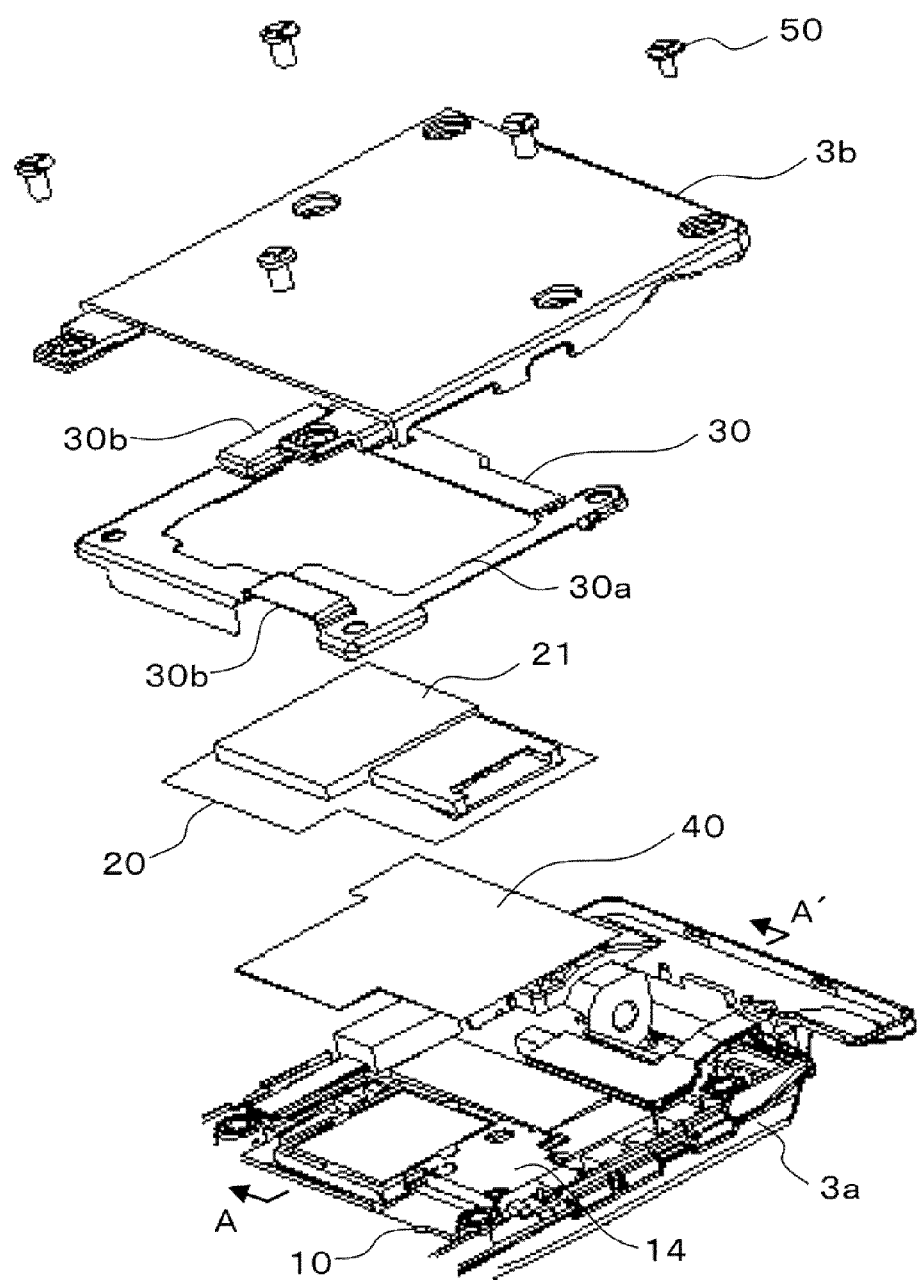
FIG. 2 is a partially developed perspective view schematically illustrating the configuration of a portable terminal according to a first exemplary embodiment of the present invention.

A portable terminal according to a first exemplary embodiment of the present invention will be described with reference to the drawings. FIG. 1 is a perspective view schematically illustrating the configuration of a portable terminal according to a first exemplary embodiment of the present invention, the terminal being shown in the opened state; FIG. 2 is a partially developed perspective view schematically illustrating the configuration of a portable terminal according to a first exemplary embodiment of the present invention; and FIG. 3 is a partial sectional view, following assembly, corresponding to the line A-A' of FIG. 2 and schematically illustrating the configuration of a portable terminal according to a first exemplary embodiment of the present invention.

With reference to FIG. 1, a portable terminal 1 has a first case 2 and a second case 3 foldably connected by a hinge portion 4. The first case 2 is provided with a display portion 5 for displaying a screen. The second case 3 is provided with a button portion 6 in which a plurality of key buttons are disposed. The second case 3 comprises an upper case 3a and a lower case 3b in combination.

Figure 3:
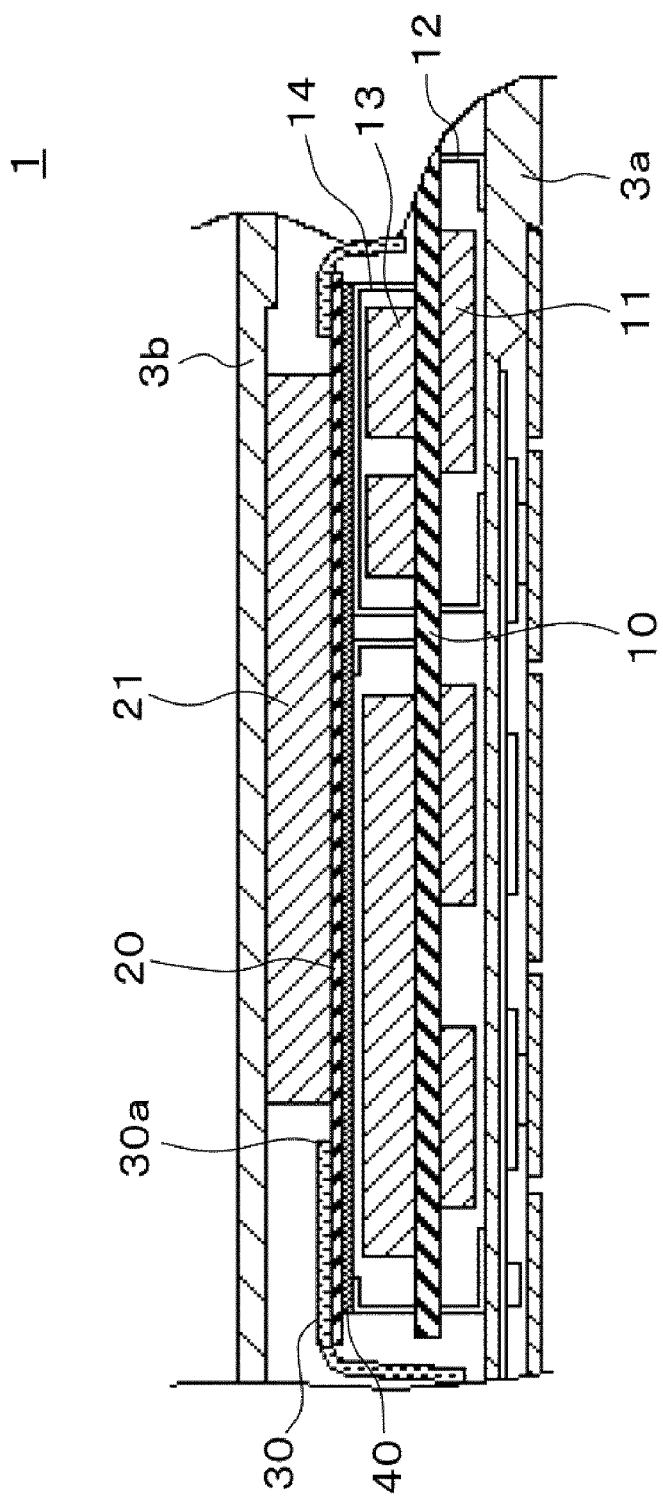
FIG. 3 is a partial sectional view, following assembly, corresponding to a line A-A' of FIG. 2 and schematically illustrating the configuration of a portable terminal according to a first exemplary embodiment of the present invention.
Figure 4:
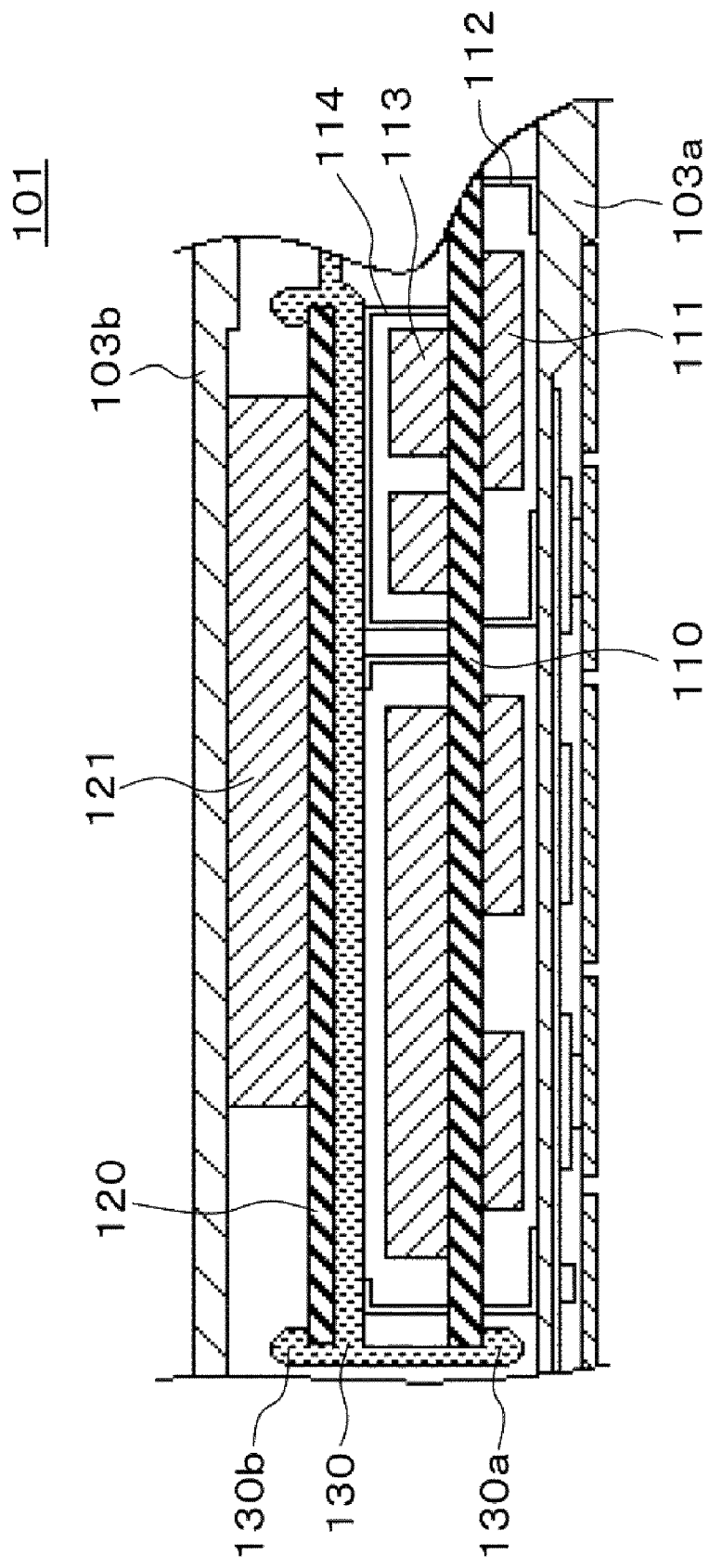
FIG. 4 is a partial sectional view schematically illustrating the configuration of a portable terminal according to a related art.

As illustrated in FIGS. 2 and 3, a substrate 10, double-sided tape 40 and a substrate 20 are disposed inside the second case 3 by being stacked between the upper case 3a and the lower case 3b in the order mentioned starting from the side of upper case 3a. A frame 30 is provided in a space between the substrate 20 and the lower case 3b and is placed on the edge portion(s) and outer peripheral portion of the substrate 20. The lower case 3b is fitted onto the upper case 3a and is fastened to the upper case 3a by screws 50.

The substrate 10 is a printed wiring board. An electronic part (component) 11 is mounted on the substrate 10 on the side thereof on which the upper case 3a is located. A shielding part (member) 12 comprising a metal plate for blocking noise of the electronic part 11 is mounted so as to cover the electronic part 11. The shielding part 12 is in abutting contact with surface on the inner side of the upper case 3a. An electronic part (component) 13 is mounted on the substrate 10 on the side thereof where the lower case 3b is located. A shielding part (member) 14 comprising a metal plate for blocking noise of the electronic part 13 is mounted so as to cover the electronic part 13. The shielding part 14 is adhered to the double-sided tape 40.

The substrate 20 is a flexible wiring board. An electronic part (component) 21 is mounted on the substrate 20 on the side thereof where the lower case 3b is located. The electronic part 21 abuts against the inner surface of the lower case 3b. It should be noted that although a shielding part has not been mounted on the substrate 20 in FIGS. 2 and 3, a shielding part may be mounted so as to cover the electronic part 21. The surface of the substrate 20 on the side of the upper case 3a is adhered to the double-sided tape 40. The substrate 20 is in abutting contact with the frame 30 at that edge portion of the substrate on the side of the lower case 3b that surrounds the electronic part 21.

The frame 30 is a member for urging the substrate 20 toward the upper case 3a in order to secure the substrates 10, 20 more strongly. The frame 30 has an opening 30a for allowing the electronic part 21 of substrate 20 to pass therethrough. The shape of the opening 30a is designed appropriately in accordance with the shape of the electronic part 21 (in a case where there are a plurality of electronic parts 21, the shape is in accordance with the shape of each of electronic parts 21 or the shape of the combination thereof). The frame 30 has a projection 30b (see FIG. 2) that abuts against the inner surface of the lower case 3b. The frame 30 urges the substrate 20 toward the upper case 3a owing to the fact that the lower case 3b is urged toward the upper case 3a by the projection 30b. The shielding part 14 of substrate 10 is placed in an area where the frame 30 and substrate 20 come into abutting contact and will not bend when the substrate 20 is urged toward the upper case 3a.

The double-sided tape 40 is for securing the substrate 20 on the shielding part 14 of substrate 10. The double-sided tape 40 has the entirety of its surface on the side of the substrate 20 adhered to the substrate 20, and has a portion of its surface of the side of the substrate 20 adhered to the shielding part 14.

The assembly comprising the substrate 10 (inclusive of the mounted electronic parts 11, 13 and shielding parts 12, 14), the substrate 20 (inclusive of the mounted electronic part 21) and the double-sided tape 40 is embraced by the upper case 3a and lower case 3b and is urged toward the upper case 3a by the frame 30, whereby the assembly is secured in the case.

In accordance with the first exemplary embodiment, the substrate 10 and the substrate 20 are secured by the double-sided tape 40 and embraced by the upper case 3a and lower case 3b, and the substrate 20 is urged toward the substrate 10. It is therefore possible to secure the substrates 10 and 20 firmly. Further, even in a case where a thin, flexible wiring board is used, as with the substrate 20, it is possible for the substrate 10 and substrate 20 to be strongly secured in similar fashion. Furthermore, since the frame 30 is so adapted that the frame urges the region of the substrate 20 in the area of the substrate other than (except for) that of the electronic part 21 toward the side of the upper case 3a, it is possible to firmly secure the assembly, which comprises the substrate 10, the substrate 20 and the double-sided tape 40, without influencing the thickness of the assembly. As a result, thinning of the portable terminal is achieved.

Within the bounds of the full disclosure of the present invention (inclusive of the scope of the claims), it is possible to modify and adjust the modes and exemplary embodiments of the invention based upon the fundamental technical idea of the invention. Multifarious combinations and selections of the various disclosed elements are possible within the bounds of the scope of the claims of the present invention.

What is claimed is:

1. A portable terminal characterized by comprising:
   a first substrate;
   a double-sided tape adhered to a prescribed portion of said first substrate;
   a second substrate adhered to said double-sided tape on a side thereof that is opposite the side on which said first substrate is located and having an electronic part mounted on a side thereof that is opposite the side affixed to said double-sided tape;

an upper case disposed on a side of said first substrate, opposite the side where said doubled-sided tape is located;

a lower case disposed on a side of the electronic part, opposite the side where said second substrate is located, and combined with said upper case; and a frame placed between said second substrate and said lower case and having an opening at a position corresponding to said electronic part.

2. A portable terminal according to claim 1, wherein an assembly comprising said first substrate, said double-sided tape and said second substrate is embraced by said upper case and said lower case.

3. A portable terminal according to claim 2, wherein said second substrate is urged toward the side of said first substrate by said frame.

4. A portable terminal according to claim 1, wherein said second substrate is a flexible wiring board.

5. A portable terminal according to claim 1, wherein said first substrate has an electronic part mounted on a side thereof on which the second substrate is located, and has a shielding part, which comprises a metal plate for blocking noise of said electronic part of said first substrate, mounted so as to cover said electronic part;

said double-sided tape being adhered to said shielding part of said first substrate.

6. A portable terminal according to claim 5, wherein said shielding part is mounted on said first substrate so as to encompass at least an area where said frame abuts against said second substrate.

7. A portable terminal according to claim 2, wherein said second substrate is a flexible wiring board.

8. A portable terminal according to claim 3, wherein said second substrate is a flexible wiring board.

9. A portable terminal according to claim 2, wherein said first substrate has an electronic part mounted on a side thereof on which the second substrate is located, and has a shielding part, which comprises a metal plate for blocking noise of said electronic part of said first substrate, mounted so as to cover said electronic part;

said double-sided tape being adhered to said shielding part of said first substrate.

10. A portable terminal according to claim 3, wherein said first substrate has an electronic part mounted on a side thereof on which the second substrate is located, and has a shielding part, which comprises a metal plate for blocking noise of said electronic part of said first substrate, mounted so as to cover said electronic part;

said double-sided tape being adhered to said shielding part of said first substrate.

11. A portable terminal according to claim 4, wherein said first substrate has an electronic part mounted on a side thereof on which the second substrate is located, and has a shielding part, which comprises a metal plate for blocking noise of said electronic part of said first substrate, mounted so as to cover said electronic part;

said double-sided tape being adhered to said shielding part of said first substrate.

12. A portable terminal according to claim 9, wherein said shielding part is mounted on said first substrate so as to encompass at least an area where said frame abuts against said second substrate.

13. A portable terminal according to claim 10, wherein said shielding part is mounted on said first substrate so as to encompass at least an area where said frame abuts against said second substrate.

14. A portable terminal according to claim 11, wherein said shielding part is mounted on said first substrate so as to encompass at least an area where said frame abuts against said second substrate.

* * * * *